US006259201B1

United States Patent
Lee et al.

(12) United States Patent
(10) Patent No.: US 6,259,201 B1
(45) Date of Patent: Jul. 10, 2001

(54) STRUCTURE OF POLYMERIC/ORGANIC ELECTROLUMINESCENT DEVICE USING IONOMER AS CHARGE TRANSPORT LAYER AND METHOD OF MAKING THE SAME

(75) Inventors: Hyang Mok Lee, Seoul; Kang Hoon Choi, Daejon; Do Hoon Hwang, Daejon; Lee Mi Do, Daejon; Taehyoung Zyung, Daejon, all of (KR)

(73) Assignee: Electronics and Telecommunications Research Institute, Daejon (KR)

( * ) Notice: Subject to any disclaimer, the term of this patent is extended or adjusted under 35 U.S.C. 154(b) by 0 days.

(21) Appl. No.: 09/124,013

(22) Filed: Jul. 29, 1998

(30) Foreign Application Priority Data

Jul. 29, 1997 (KR) .................................................. 97-35716

(51) Int. Cl.[7] ........................................................ B32B 27/00
(52) U.S. Cl. ........................... 313/504; 313/506; 428/917
(58) Field of Search ..................................... 313/506, 504, 313/503; 315/169.3; 428/690, 917

(56) References Cited

U.S. PATENT DOCUMENTS 5,540,999 * 7/1996 Yamamoto et al. ............. 313/506 X
5,917,279 * 6/1999 Elschnet et al. .................... 313/506
5,969,474 * 10/1999 Arai et al. ...................... 313/506 X

OTHER PUBLICATIONS

Enhancement of Light Emitting Diodes Based on Self–Assembled Heterostructures of Poly(P–Phenylene Vinylene); O. Onitsuka, A.C. Fou, M. Ferreira, B.R. Hsieh, and M.F. Rubner; vol. 80, No. 7, Oct. 1, 1996; pp. 4067–4071.

* cited by examiner

Primary Examiner—Ashok Patel
(74) Attorney, Agent, or Firm—Antonelli, Terry, Stout & Kraus, LLP

(57) ABSTRACT

The present invention relates to an electroluminescent device, which is characterized in that it uses polymer made of ionomer containing metal ions as a charge transport layer. The ionomer contains an ionized metallic salt and the polymer forms a physical cross-linking around the metal. Thus, it has not only a good mechanical property but also a superior thermal stability. Also it shows an ion conductivity due to movement of ion under electric field, and the conductivity can be controlled by varying the concentration of the substituted ion. The ionomer layer can be easily obtained by spin coating method. In addition, the light-emittive quantum efficiency can be greatly increased by inserting the ionomer layer between the electrode and the light-emitting layer to form a stabilized interface. On the other hand, it can be applied to manufacturing of the flexible electroluminescent device because the ionomer is also a polymer.

4 Claims, 1 Drawing Sheet

STRUCTURE OF POLYMERIC/ORGANIC ELECTROLUMINESCENT DEVICE USING IONOMER AS CHARGE TRANSPORT LAYER AND METHOD OF MAKING THE SAME

BACKGROUND OF THE INVENTION

1. Field of the Invention

The present invention relates to an electroluminescent device. In particular, the present invention relates to the structure of polymeric/organic electroluminescent device using ionomer as a charge transport layer and method of making the same.

2. Description of the Prior Art

In case of a conventional organic or polymeric electroluminescent device, for the purpose of an efficient light-emission, an electron transport layer and a hole transport layer are each used in the upper or lower layers of the light-emitting layer, respectively. However, the conventional eletroluminescent device has problems that not only selecting respective carrier layers is very difficult but also the luminous efficiency thereof is not so effective.

SUMMARY OF THE INVENTION

It is an object of the present invention to solve the problems of the prior art, and to provide an electroluminescent device which is improved in the stability and also is increased in the quantum efficiency by using ionomer as a charge transport layer in the upper and lower ends of the organic polymeric light-emitting layer.

In order to achieve the above purpose, the structure of a polymeric/organic electroluminescent device according to the present invention is characterized in that a transparent electrode layer is formed on a transparent plastic substrate; a first ionomer layer is formed on the transport electrode layer is; a light-emitting layer formed on the first ionomer layer is; a second ionomer layer is formed on the light-emitting layer; and a metal electrode layer is formed on the second ionomer layer.

The method of manufacturing a polymeric/organic material electroluminescent device according to the present invention comprises the steps of forming a transparent electrode layer on a transparent plastic substrate; forming a first ionomer layer on the transparent electrode layer; forming a light-emitting layer on the first ionomer layer; forming a second ionomer layer on the light-emitting layer; and forming a metal electrode layer on the second ionomer layer.

Since various types of ionomers can be easily employed, ionomer may be adequately used for various fields. Therefore, ionomer used as a charge transport layer in the present invention has the following advantages:

First, since ionomer has basically metallic ions, it has an electric transporting mechanism different from a prior charge transport layer under an electrical field.

Second, in case that a thin film is formed between an electrode and an organic or polymeric emissive material, the quantum efficiency of the light-emitting device can be increased because the stability of the interface can be increased.

Third, a thin ionomer layer can be easily formed even by use of a conventional spin coating method.

Fourth, the mechanical property of an ionomer can be applied to flexible electroluminescent display when used on a plastic substrate.

BRIEF DESCRIPTION OF THE DRAWINGS

The above object, other features and advantages of the present invention will become more apparent by describing the preferred embodiment thereof with reference to the accompanying drawings, in which.

Similar reference characters refer to similar parts in the several views of the drawings.

DETAILED DESCRIPTION OF PREFERRED EMBODIMENTS

An embodiment of the present invention will be explained below in detail by reference to the attached drawings.

Figure 1:
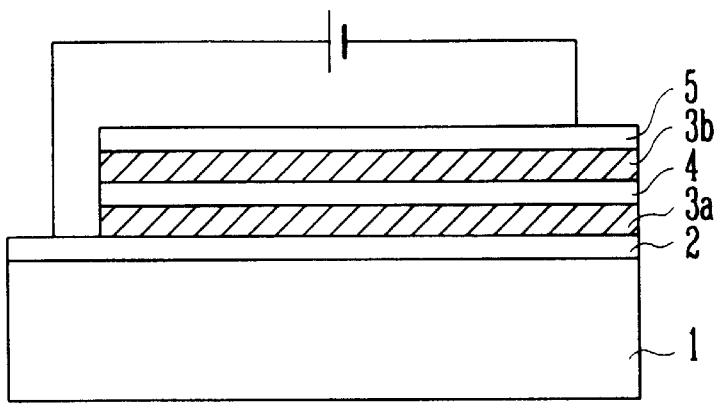
FIG. 1 is a cross-sectional view of an electroluminscent device in accordance with the present invention.

FIG. 1 is a cross-sectional view of an organic or polymeric electroluminscent device using ionomer as a charge transport layer, illustrating the construction according to the present invention.

A transparent electrode layer 2 (for example ITO) for injecting hole is formed on a transparent plastic substrate 1. After a first ionomer layer 3a is formed on the transparent electrode layer 2 by spin coating method, an organic or polymeric light-emitting layer 4 is formed on the first ionomer layer 3a. The organic or polymeric light-emitting layer 4 may be formed by vacuum evaporation method or spin coating method. However, if the spin coating method is used, solvent which does not affect ionomer has to be used.

Next, after the organic or polymeric light-emitting layer 4 is formed, a second ionomer 3b is again formed by spin coating method. As in the above case, solvent which does not affect the light-emitting layer 4 also has to be used. Then, a metal electrode layer 5 for electron injection is formed on the second ionomer layer 3b by vacuum evaporation method. At this time, the metal electrode layer to be deposited uses metal the work function of which is less than that of the transparent electrode material. For example, metal includes aluminum Al, calcium Ca or magnesium Mg etc. After the ionomer is spin-coated in each process, it is sufficiently dried over the boiling temperature of the solvent and the glass transition temperature in the oven so that any remaining solvent can be removed. When a current flows between the transparent electrode 2 and the metal electrode 5 in the device having this structure, due to influences by the ionomer, the improved light-emissive quantum efficiency of the device at the organic or the polymeric light-emitting layer 4 can be obtained along with the improved stability of the device. Meanwhile, after the ionomer is spin-coated on the ITO glass, it is thermally dried to form a single layer and then an adhesion test by means of a tape is performed for it. From the test, there was no any adhesive problems involved with the thin film formed by the ionomer. As a result, it can be seen that the adhesive power between the electrode and the light-emitting polymer layer can be greatly improved by means of the ionomer.

Figure 2:
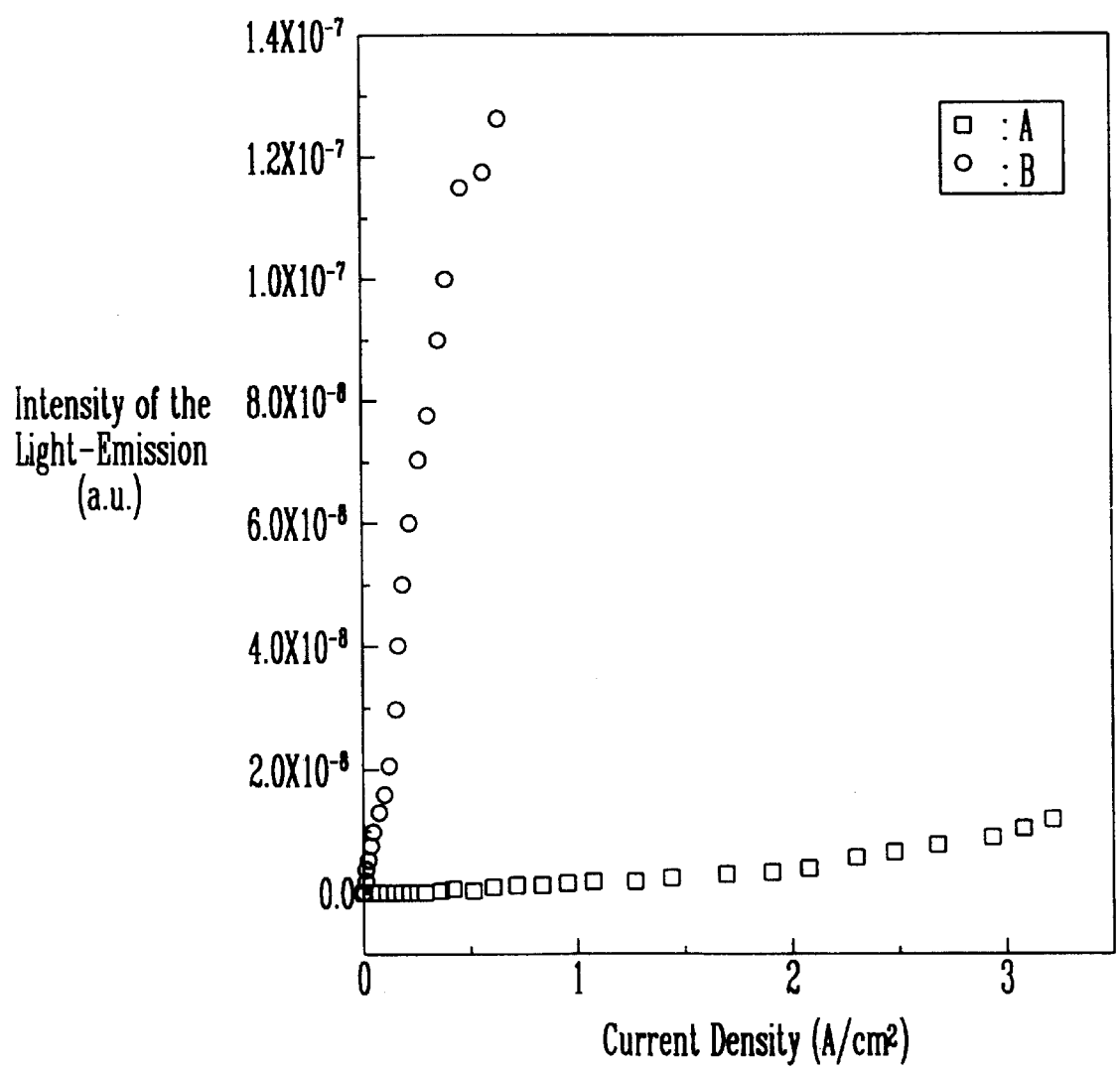
FIG. 2 shows a graph illustrating its light-emission intensity variation as a function of the current density applied to the electroluminescent device.

FIG. 2 shows a graph illustrating the light-emission intensity variation as a function of the current density in the electric light-emitting device which uses an electroluminscent conjugated polymer as an light-emitting layer and also uses ionomer as a charge transport layer, wherein the used ionomer contains 10 mol % of a cationic group and an anionic group. In FIG. 2, a symbol A indicates that it is obtained from the polymer electroluminescent device without ionomer, while a symbol B indicates that it is obtained from the polymer electroluminescent device containing the ionomer as an electron or hole transport layer. For the electron or hole transport layer, the thickness of the ionomer layer should be adequately controlled and the ITO and Al should be also used as a transparent metal and the metal electrode, respectively. According to the graph shown in FIG. 2, it can be seen that the intensity of the emitted light with respect to the same current density in the device using ionomer is about 100 times higher than that in the device without using the ionomer.

As described above, according to the present invention, the electrolunescent device using ionomer as a charge transport layer can form a stable interface between an electrode and an organic or a polymeric light-emitting layer and also can improve the light-emissive quantum efficiency at the light-emitting layer. Therefore, an electroluminescent display having an generally improved performance can be easily implemented. Also, in formation of ionomer layer, since it employs a conventional spin coating method, it can manufacture a device with a low cost and an easy process. Additionally, due to the mechanical property of ionomer, it can be applied to manufacturing of a rollable wall-type TV screen.

While the present invention has been described and illustrated herein with reference to the preferred embodiment thereof, it will be understood by those skilled in the art that various changes in form and details may be made therein without departing from the spirit and scope of the invention.

What is claimed is:

1. A polymeric/organic electroluminescent device, comprising:

a transparent electrode layer formed on a transparent plastic substrate;

a first ionomer layer formed on the transparent electrode layer for transporting hole;

a light-emitting layer formed on the first ionomer layer;

a second ionomer layer formed on the light-emitting layer for transporting electron; and a metal electrode layer formed on the second ionomer layer.

2. The polymeric/organic electroluminescent device of claim 1, wherein said first and second ionomer layers contain ionomer with 10 mol % of a cationic group and an anionic group.

3. An electro-luminescent device comprising:

a substrate;

a transparent electrode disposed on said substrate;

a first ionomer layer formed on said transparent electrode for transporting current carriers;

an organic/polymeric light-emitting layer formed on said first ionomer layer;

a second ionomer layer formed on said organic/polymeric light-emitting layer for transporting current carriers; and a metal electrode disposed on said second ionomer layer for electron injection.

4. The electro-luminescent device of claim 3, wherein said first and second ionomer layers contain ionomer with 10 mol % of a cationic group and an anionic group.

* * * * *